United States Patent
Masuko et al.

(10) Patent No.: US 6,337,028 B1
(45) Date of Patent: Jan. 8, 2002

(54) PROCESS OF FORMING A PATTERN ON A SUBSTRATE

(75) Inventors: Hideaki Masuko; Tadahiko Udagawa; Hiroaki Nemoto, all of Mie; Nobuo Bessho, Kanagawa, all of (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/189,400

(22) Filed: Nov. 10, 1998

(30) Foreign Application Priority Data

Nov. 12, 1997 (JP) ............................................. 9-310837
Nov. 26, 1997 (JP) ............................................. 9-340514

(51) Int. Cl.$^7$ ............................................. H04B 33/12
(52) U.S. Cl. ............................... 216/4; 216/13; 216/20; 216/36; 430/317; 430/318; 430/323; 156/235; 156/237
(58) Field of Search ................................. 156/230, 235, 156/237, 278, 280, 297, 299, 349, 239, 247, 289, 427, 146, 147; 216/4, 13, 20, 24, 25, 33, 35, 36, 54; 430/313, 317, 318, 321, 323

(56) References Cited

U.S. PATENT DOCUMENTS

| 4,614,706 A | 9/1986 | Matsuzawa et al. | 430/313 |
|---|---|---|---|
| 5,306,653 A | 4/1994 | Hur | 437/40 |
| 5,407,862 A | 4/1995 | Miyamoto | 437/192 |
| 5,476,807 A | 12/1995 | Lee et al. | 437/52 |
| 5,614,060 A | 3/1997 | Hanawa | 156/643.1 |
| 5,648,298 A | 7/1997 | Cho | 437/187 |
| 5,792,589 A | 8/1998 | Udagawa | 430/270.1 |
| 5,909,083 A | * 6/1999 | Asano et al. | 313/584 |
| 5,916,401 A | * 6/1999 | Gannon | 156/240 |
| 6,156,433 A | * 12/2000 | Hatori et al. | 428/411.1 |

FOREIGN PATENT DOCUMENTS

| EP | 0 877 003 | 11/1998 | |
|---|---|---|---|
| JP | 05205627 | 8/1993 | |
| JP | 05205632 | 8/1993 | |
| JP | 05205633 | 8/1993 | |
| JP | 06075372 | 3/1994 | |
| JP | 06321619 | 11/1994 | |
| JP | 9-92137 | * 9/1997 | ............. H01J/9/02 |

OTHER PUBLICATIONS

Derwent Abstracts, AN 97–278481, JP 09 102273, Apr. 15, 1997.
Derwent Abstracts, AN 97–264843, JP 09 092137, Apr. 4, 1997.
Derwent Abstracts, AN 97–216778, JP 09 061996, Mar. 7, 1997.
Patent Abstracts of Japan, vol. 097, No. 010, Oct. 31, 1997, JP 09 142878, Jun. 3, 1997.

* cited by examiner

Primary Examiner—Randy Gulakowski
Assistant Examiner—Allan Olsen
(74) Attorney, Agent, or Firm—Oblon, Spivak, McClelland, Maier & Neustadt, P.C.

(57) ABSTRACT

A process for forming an inorganic material layer pattern on a substrate. The process includes the steps of transferring an inorganic powder dispersed paste layer supported on a support film to the surface of the substrate to form the inorganic powder dispersed paste layer on the substrate; forming a resist film on the inorganic powder dispersed paste layer transferred to the surface of the substrate; exposing the resist film to light through a mask to form a latent image of a resist pattern; developing the exposed resist film to form the resist pattern; etching exposed portions of the inorganic powder dispersed paste layer to form an inorganic powder dispersed paste layer pattern corresponding to the resist pattern; and baking the pattern to form an inorganic material layer pattern.

14 Claims, 4 Drawing Sheets

PROCESS OF FORMING A PATTERN ON A SUBSTRATE

DETAILED DESCRIPTION OF THE INVENTION

The present invention relates to a process for forming an inorganic material layer pattern on a substrate and, more specifically, to a pattern formation process suitable for the production of a plasma display panel, which enables the formation of a very fine pattern for a panel material forming each display cell of a plasma display panel and which can substantially improve workability using a transfer film compared with the process of the prior art.

Of flat panel display technologies, a plasma display panel (PDP) attracts much attention because its production process is easy though it is a large-sized panel and it has a wide view angle and is of a self light emission type with high display quality. Particularly, a color plasma display panel is expected to become the main stream of the market as a display device for 20-inch or more wall TVs in the future.

A color PDP can display colors by irradiating a fluorescent material with ultraviolet light generated by gas discharge. Generally speaking, the color PDP has a constitution such that fluorescent sites for emitting red color, fluorescent sites for emitting green color and fluorescent sites for emitting blue color are formed on a substrate so that light emitting display cells for respective colors are uniformly existent over the entire panel. Specifically, barriers ribs made from an insulating material are provided on the surface of a substrate made from glass or the like, many display cells are defined by the barrier ribs, and the inside of each display cell serves as a plasma function space. Each fluorescent site is formed in this plasma function space and an electrode for causing plasma to act on the fluorescent site is provided at this fluorescent site, whereby a plasma display panel comprising display cells as display units is formed.

FIG. 1 show an example of the structure of an AC type PDP. A pair of maintenance electrodes 6A are formed in the form of stripes on a front side substrate glass 1, a dielectric layer 3 covers the maintenance electrodes 6A and a MgO film 3A as a protective film is vapor-deposited on the dielectric layer 3. In FIG. 1, reference numeral 10 denotes bus lines.

To improve the contrast of the plasma display panel, red, green and blue colors filters and a black matrix (not shown) may be provided under the dielectric layer.

On a rear side substrate glass 2, signal electrodes 6B are formed in the form of stripes, barrier ribs 5 are provided between adjacent signal electrodes, and a fluorescent layer 4 is formed on the side and bottom of each of the barrier ribs 5.

The front side substrate and the rear side substrate are joined together and sealed in such a manner that the maintenance electrodes of the front side substrate and the signal electrodes of the rear side substrate cross each other at right angles, and a mixed gas of neon and xenon is introduced into the inside.

FIG. 2 shows an example of the structure of a DC type PDP. Cathode electrodes 6 a are formed in the form of stripes on the front side substrate glass 1.

On a rear side glass substrate, the electrode terminals and leads 6b' and 6c' of display anodes 6b and auxiliary anodes 6c are formed, and a resistor 7 is further provided between the anode terminal and the anode lead and between the auxiliary anode terminal and the auxiliary anode lead. The rear substrate is insulated with a dielectric 3 excluding the display anode terminals and the auxiliary anode terminals. Thereafter, to define a discharge space, barrier ribs 5 are provided in the form of a lattice and a fluorescent layer 4 is formed on the side and bottom excluding the anode terminal of each barrier rib. In FIG. 2, the reference numeral 8 denotes a display cell and the reference numeral 9 denotes an auxiliary cell.

The front side substrate and the rear side substrate are joined together and sealed in such a manner that the cathode 6a of the front side substrate and the display anode 6b and the auxiliary anode 6c of the rear side substrate cross each other at right angles, and a mixed gas of neon and xenon is introduced into the inside.

As a process for forming a pattern for panel materials such as the barrier ribs, electrodes, resistors, fluorescent materials, color filters and black matrix of the above plasma display panel, there are known (1) a screen-printing process which comprises screen-printing a non-photosensitive inorganic powder dispersed paste composition on a substrate to form a pattern and baking it; (2) a photolithography which comprises forming a photosensitive inorganic powder dispersed paste composition film on a substrate, exposing the film to ultraviolet light through a photomask, developing the exposed film to form a pattern on the substrate and baking it; and the like.

However, in the above screen printing process, the requirement for the positioning accuracy of a pattern is becoming more and more severe along with an increase in the size of a panel and a reduction in pattern width, and general printing cannot satisfy the requirement.

Also, in the above photolithography, the sensitivity in a depth direction of an inorganic powder dispersed paste layer is unsatisfactory and a very fine pattern with sharp edges cannot be always obtained when a 10 to 100 $\mu$m-thick film pattern is to be formed with a one time of exposure and development.

It is an object of the present invention to provide a novel process for forming an inorganic material layer pattern on a substrate.

It is another object of the present invention to provide a process for forming a pattern suitable for the production of a plasma display panel.

It is still another object of the present invention to provide a process for forming a pattern having high dimensional accuracy.

It is a further object of the present invention to provide a process for forming a pattern, which can substantially improve workability and has excellent production efficiency as compared with the process of the prior art.

It is a still further object of the present invention to provide a transfer film having an inorganic powder dispersed paste layer for forming the above inorganic material layer, which is advantageously used to carry out the process of the present invention.

Other objects and advantages of the present invention will become apparent from the following description.

According to the present invention, firstly, the above objects and advantages of the present invention can be attained by a process for forming an inorganic material layer pattern on a substrate (to be referred to as "the first process of the invention"), which comprises the steps:

(1) transferring an inorganic powder dispersed paste layer supported on a support film to the surface of the substrate to form the inorganic powder dispersed paste layer on the substrate;

(2) forming a resist film on the inorganic powder dispersed paste layer transferred to the surface of the substrate;

(3) exposing the resist film to light through a mask to form a latent image of a resist pattern;

(4) developing the exposed resist film to form the resist pattern;

(5) etching exposed portions of the inorganic powder dispersed paste layer to form an inorganic powder dispersed paste layer pattern corresponding to the resist pattern; and (6) baking the pattern to form an inorganic material layer pattern.

Figure 1:
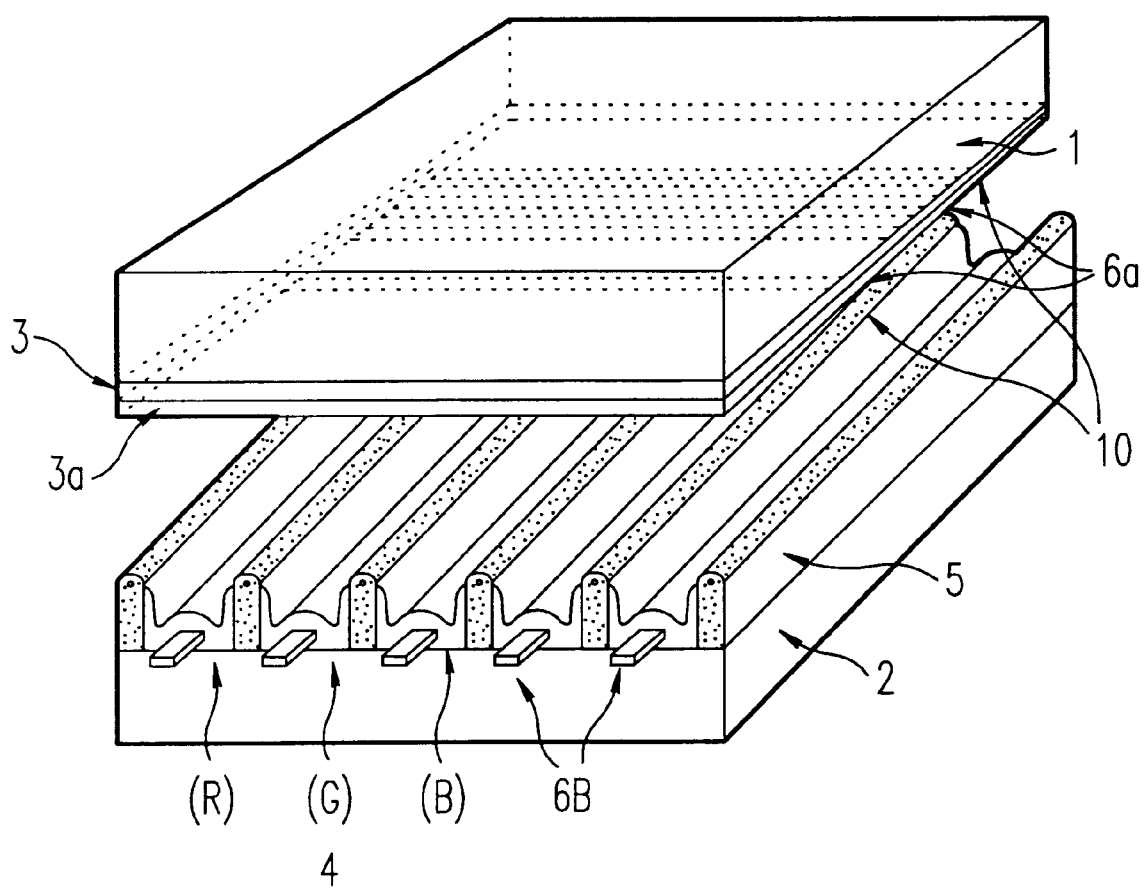
FIG. 1 is a sectional view of a general AC type PDP.
Figure 2:
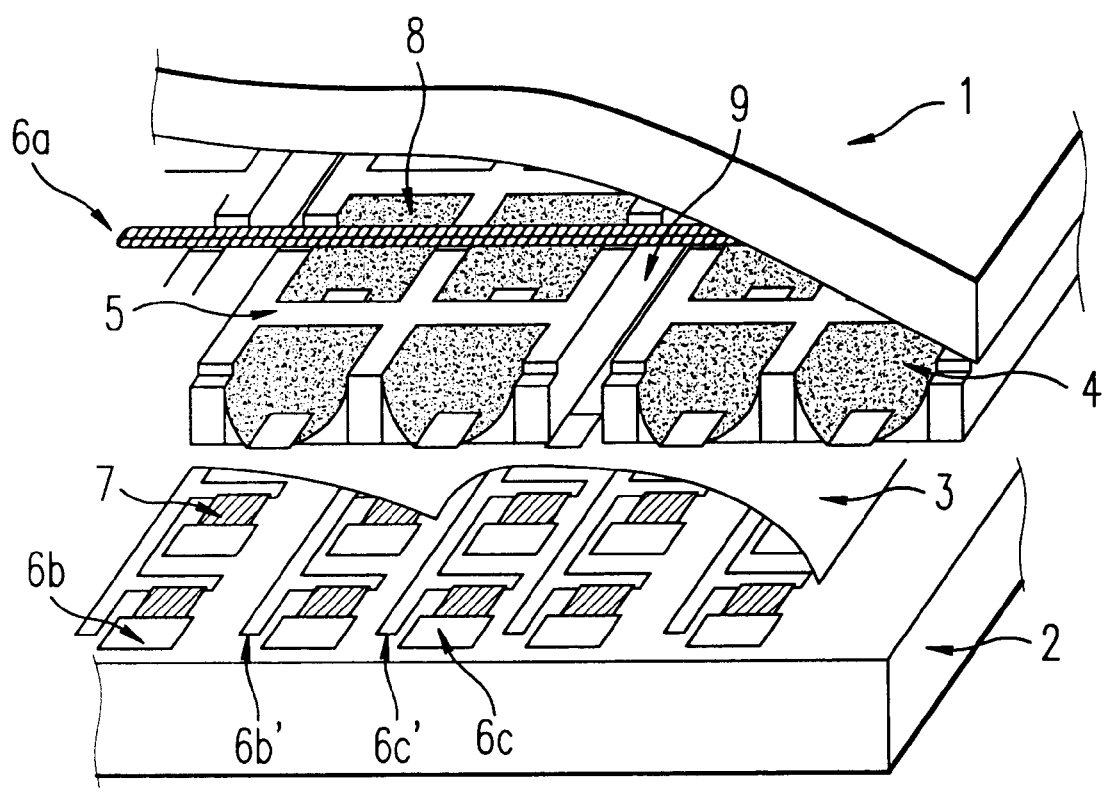
FIG. 2 is a sectional view of a general DC type PDP.

The process of the present invention consists of steps (1) to (6).

That is, the process of the present invention consists of (1) the step of transferring an inorganic powder dispersed paste layer, (2) the step of forming a resist film, (3) the step of exposing the resist film, (4) the step of developing the resist film, (5), the step of etching the inorganic powder dispersed paste layer, and (6) the step of baking the inorganic powder dispersed paste layer pattern.

Each step will be described with reference to the accompanying drawings.

<Step of Transferring Inorganic Powder Dispersed Paste Layer>

In the step (1), an inorganic powder dispersed paste layer supported on a support film is transferred to the surface of a substrate to form the inorganic powder dispersed paste layer on the substrate. The inorganic powder dispersed paste layer is formed not by coating an inorganic powder dispersed paste composition in which inorganic powder is dispersed, such as a composition for forming barrier ribs or a composition for forming electrodes, directly on a substrate having rigidity a by transferring the above paste layer supported on the support film having flexibility. The paste composition can be coated on the support film with a roll coater or the like, thereby making it possible to form an inorganic powder dispersed paste layer having a large thickness (for example, 10 μm±1 μm) and excellent uniformity in thickness on the support film. The inorganic powder dispersed paste layer can be formed without fail by the simple operation of transferring the thus formed inorganic powder dispersed paste layer to the surface of the substrate en bloc. Therefore, according to the process of the present invention, the step of forming an inorganic powder dispersed paste layer can be improved (increase in efficiency) and the quality of the formed pattern can be also improved (increase in the fineness of pattern).

FIG. 3 and FIG. 4 are schematic sectional views showing one example of the steps of forming an inorganic powder dispersed paste layer in the production process of the present invention. In FIG. 3(a), reference numeral 11 denotes a glass substrate.

The production process of the present invention has significant characteristics in that a transfer film is used to transfer the inorganic powder dispersed paste layer forming the transfer film to the surface of the substrate.

The transfer film comprises a support film and an inorganic powder dispersed paste layer formed on the support film, and a protective film layer may be formed on the surface of the inorganic powder dispersed paste layer. The constitution of the transfer film will be described hereinafter.

Figure 3A:
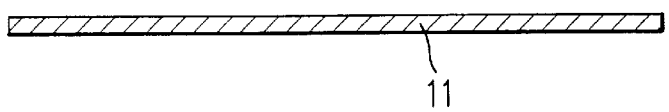
FIG. 3 is a sectional view showing the production process of a plasma display panel according to an embodiment of the present invention in the order of its steps.
Figure 3B:
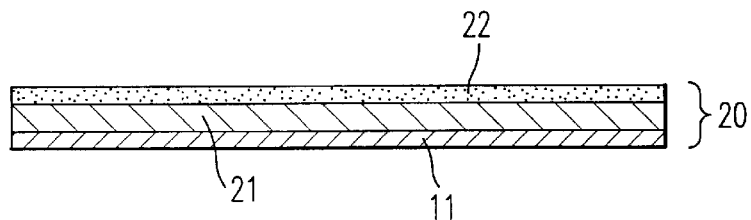
Figure 3C:
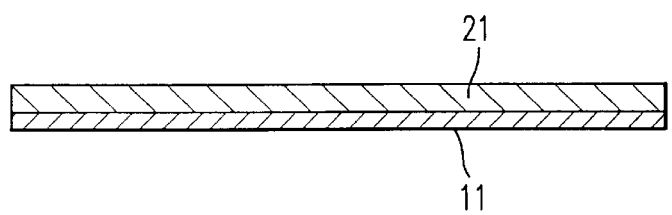

An example of the transfer step is as follows. After the protective film layer of the transfer film used as required is removed, the transfer film 20 is placed on the surface of the glass substrate 11 in such a manner that the surface of the inorganic powder dispersed paste layer 21 comes in contact with the surface of the substrate 11, as shown in FIG. 3(b), and thermally pressed by a heating roller, and then the support film 22 is removed from the inorganic powder dispersed paste layer 21. Thereby, the inorganic powder dispersed paste layer 21 is transferred and closely adhered to the surface of the glass substrate 11 as shown in FIG. 3(c). When the inorganic powder dispersed paste layer pattern is used to form electrodes, a reflection reducing film may be formed between the glass substrate and the inorganic powder dispersed paste layer, and when the inorganic powder dispersed paste layer pattern is used to form barrier ribs, a reflection reducing film may be formed on the inorganic powder dispersed paste layer (that is, between the layer and a resist film which will be described later). Although the reflection reducing film may be formed by a prior art process such as screen printing or the like, a transfer film having a laminate film consisting of the inorganic powder dispersed paste layer and the reflection reducing film is preferably used.

Transfer conditions include a heating roller surface temperature of 80 to 140° C., a heating roll pressure of 1 to 5 kg/cm$^2$, and a heating roll moving speed of 0.1 to 10.0 m/min. The glass substrate may be preheated at 40 to 100° C., for example.

In the production process of the present invention, it is preferred to transfer and form on the substrate a laminate consisting of a plurality of inorganic powder dispersed paste layers which differ in solubility in an etching solution.

By etching this laminate, anisotropy in a depth direction of etching is produced, thereby making it possible to form a material layer residual portion having a preferred rectangular section or section close to a rectangular shape.

The number (n) of inorganic powder dispersed paste layers to be laminated together is generally 2 to 10, preferably 2 to 5.

To form a laminate consisting of an n number of inorganic powder dispersed paste layers, (1) an inorganic powder dispersed paste layer (single layer) formed on the support film is transferred an n number of times, or (2) a laminate consisting of an n number of inorganic powder dispersed paste layers is transferred en bloc. The method (2) is preferred from the viewpoint of simplifying the transfer step.

<Step of Forming Resist Film>

Figure 3D:
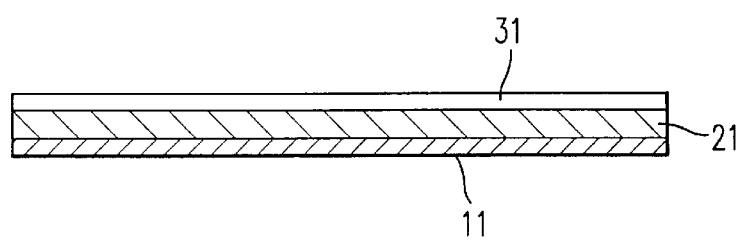

In this step (2), as shown in FIG. 3(d), a resist film 31 is formed on the surface of the transferred inorganic powder dispersed paste layer 21. A resist forming this resist film 31 may be either positive or negative type. The composition of the resist will be described hereinafter.

The resist film 31 can be formed by coating a resist by screen printing, roll coating, rotation coating, cast coating or the like and drying the coated film.

The resist film formed on the support film may be transferred to the surface of the inorganic powder dispersed paste layer 21. According to this formation method, the step of forming a resist film can be improved (increase in efficiency) and the thickness uniformity of the formed inorganic powder pattern can also be improved.

The thickness of the resist film 31 is generally 0.1 to 40 µm, preferably 0.5 to 20 µm.

<Step of Exposing Resist Film>

Figure 3E:
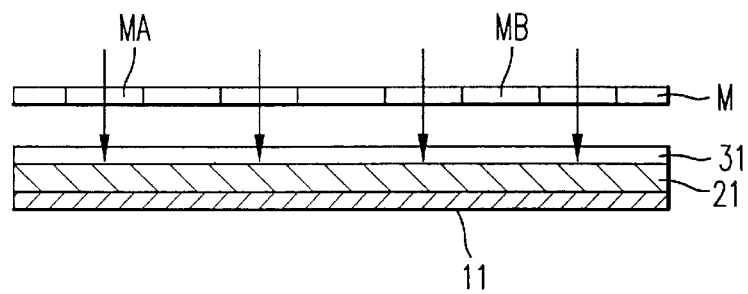

In this step (3), as shown in FIG. 3(e), the surface of the resist film 31 formed on the inorganic powder dispersed paste layer 21 is selectively exposed to radiation such as ultraviolet radiation through an exposure mask M to form a latent image of a resist pattern. In the figure, MA and MB denote light transmitting portions and light shielding portions of the exposure mask M, respectively.

A radiation irradiating device is not particularly limited and may be an ultraviolet irradiating device used in the above photolithography or an exposure device used to produce semiconductors and liquid crystal display devices.

<Step of Developing Resist Film>

In this step (4), the exposed resist film is developed to form a resist pattern (latent image).

As development conditions, there can be suitably selected a type, composition and concentration of a developer, developing time, developing temperature, developing method (such as immersion, rocking, shower, spray or puddling method) and a developing device, according to the type of the resist film 31.

Figure 4F:
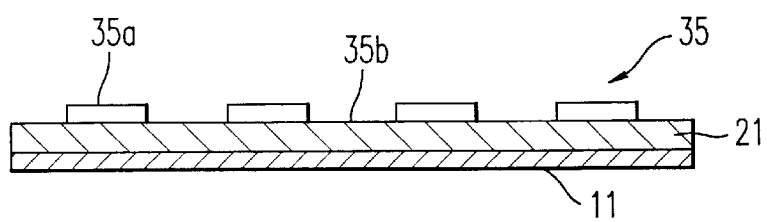
FIG. 4 is a sectional view showing the subsequent steps after the steps of FIG. 3 of the production process according to the embodiment of the present invention.

By this development step, a resist pattern 35 consisting of resist remaining portions 35A and resist removed portions 35B is formed (pattern corresponding to the exposure mask M) as shown in FIG. 4(f).

This resist pattern 35 serves as an etching mask in the subsequent step (etching step) and a material forming the resist remaining portions 35A (photo-cured resist) must have a lower dissolution speed in an etching solution than a material forming the inorganic powder dispersed paste layer 21.

<Step of Etching Inorganic Powder Dispersed Paste Layer>

In this step (5), the inorganic powder dispersed paste layer is etched to form an inorganic powder dispersed paste layer pattern corresponding to the resist pattern.

Figure 4G:
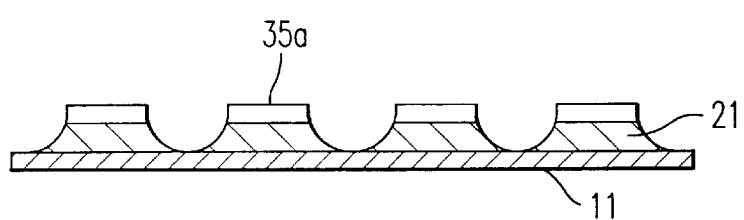

That is, as shown in FIG. 4(g), portions corresponding to the resist removed portions 35B of the resist pattern 35 of the inorganic powder dispersed paste layer 21 are dissolved in the etching solution and selectively removed. FIG. 4(g) shows a state that the inorganic powder dispersed paste layer is being etched.

Figure 4H:
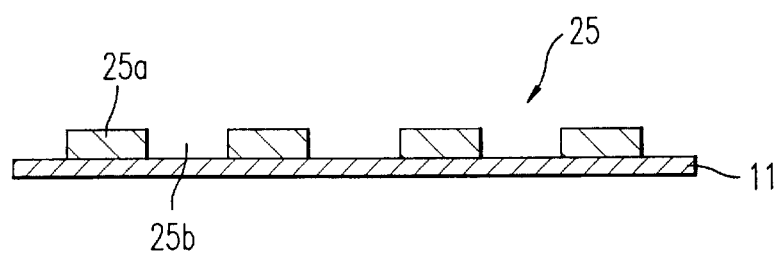

When etching is continued, as shown in FIG. 4(h), the surface of the glass substrate is exposed at the portions corresponding to the resist removed portions of the inorganic powder dispersed paste layer 21. Thereby, an inorganic powder dispersed paste layer pattern 25 consisting of material layer remaining portions 25A and material layer removed portions 25B is formed.

As etching conditions, there can be suitably selected a type, composition and concentration of the etching solution, treatment time, treatment temperature, treatment method (such as immersion, rocking, shower, spray or puddling treatment) and a treatment device according to the type of the inorganic powder dispersed paste layer 21.

The types of the resist film 31 and the inorganic powder dispersed paste layer 21 are selected so that a solution similar to the developer used in the developing step can be used as the etching solution, thereby making it possible to carry out the developing step and the etching step continuously with the result of improved production efficiency due to the simplification of the process.

It is preferred that the resist remaining portions 35A forming the resist pattern 35 should be dissolved gradually by etching and completely removed when the inorganic powder dispersed paste layer pattern 25 is formed (when etching is completed).

Even when part or all of the resist remaining portions 35A remain after etching, the resist remaining portions 35a are removed in the subsequent baking step.

<Step of Baking Inorganic Powder Dispersed Paste Layer Pattern>

Figure 4I:
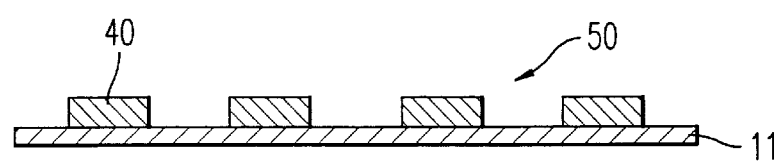

In this step (6), the inorganic powder dispersed paste layer pattern 25 is baked. Thereby, organic substances contained in the material layer remaining portions are calcined, a metal layer or an inorganic material layer such as a glass layer is formed, an inorganic material layer pattern 40 is formed on the surface of the glass substrate as shown in FIG. 4(i), and a panel material 50 in which, for example, the inorganic material layer is an electrode or barrier rib can be eventually obtained.

The baking temperature must be a temperature at which the organic substances contained in the material layer remaining portions 25A can be burnt, generally 400 to 600° C. The baking time is generally 10 to 90 minutes.

According to the present invention, there is also provided a process for forming an inorganic material layer pattern on a substrate (to be referred to as "the second process of the invention" hereinafter).

That is, according to the present invention, there is also provided a process for forming an inorganic material layer pattern on a substrate, which comprises the steps of:

(1) transferring a laminate, in which a resist film and an inorganic powder dispersed paste layer are laminated and supported on a support film in this order, to the surface of the substrate to form on the substrate the laminate film in which the inorganic powder dispersed paste layer and the resist film are laminated in this order;

(2) exposing the resist film to light through a mask to form a latent image of a resist pattern;

(3) developing the exposed resist film to form the resist pattern;

(4) etching exposed portions of the inorganic powder dispersed paste layer to form an inorganic powder dispersed paste layer pattern corresponding to the resist pattern; and (5) baking the pattern to form an inorganic material layer pattern.

In the above step (1), there is used the laminate film in which the resist film and the inorganic powder dispersed paste layer are laminated and supported on the support film in this order. This laminate film is formed by forming the resist film on the support film and then forming the inorganic powder dispersed paste layer on the resist film. To form the resist film and the inorganic powder dispersed paste layer, a roll coater may be used, thereby making it possible to form a laminate film having excellent thickness uniformity can be formed on the support film.

The laminate film consisting of the resist film and the inorganic powder dispersed paste layer formed on the support film is transferred to the surface of the substrate. Transfer conditions may be the same as those in the aforementioned <step of transferring an inorganic powder dispersed paste layer> of the first process of the invention. As described in the <step of transferring an inorganic powder dispersed paste layer>, a reflection reducing film may be formed on or under the inorganic powder dispersed paste layer. The above steps (2), (3), (4) and (5) can be carried out by the same operations as those in the <steps of exposing a resist film, developing a resist film, etching an inorganic powder dispersed paste layer and baking an inorganic powder dispersed paste layer pattern> in the first process of the invention.

According to the above process, since the inorganic powder dispersed paste layer and the resist film are transferred to the surface of the substrate en bloc, production efficiency can be further improved by the simplification of the process.

The process of the present invention can be used not only in the formation of electrodes and barrier ribs but also in the formation of a resistor, fluorescent material, color filter or black matrix for a plasma display panel.

Materials and conditions used in each step of the process will be described hereinafter.

<Substrate>

The material of the substrate is a plate-like material made from an insulating material such as glass, silicon, polycarbonate, polyester, aromatic amide, polyamide imide or polyimide. A proper pretreatment such as a chemical treatment with a silane coupling agent, plasma treatment, or thin film formation treatment by ion plating, sputtering, vapor phase reaction or vacuum deposition may be made on the surface of this plate-like member.

<Transfer film>

The transfer film used in the production process of the present invention has a support film and an inorganic powder dispersed paste layer formed on the support film. A protective film layer may be formed on the surface of the inorganic powder dispersed paste layer.

(1) Support Film

The support film-forming the transfer film is preferably a resin film having not only heat resistance and solvent resistance but also flexibility. Due to the flexibility of the support film, a paste composition can be coated on the support film with a roll coater, and the inorganic powder dispersed paste layer can be stored and supplied in the form of a roll. A resin forming the support film is selected from polyethylene terephthalate, polyester, polyethylene, polypropylene, polystyrene, polyimide, polyvinyl alcohol, polyvinyl chloride, fluorine-containing resin such as polyfluoroethylene, nylon, cellulose and the like. The thickness of the support film is, for example, 20 to 100 $\mu$m.

(2) Inorganic Powder Dispersed Paste Layer

The inorganic powder dispersed paste layer forming the transfer film can be formed by coating the support film with a pasty inorganic powder dispersed paste composition containing inorganic powder, a binding resin and a solvent as essential ingredients, such as a composition for forming electrodes or a composition for forming barrier ribs and drying the coated film to remove part or all of the solvent.

(3) Inorganic Powder Dispersed Paste Composition

The inorganic powder dispersed paste composition used to form the transfer film is a pasty composition containing (a) inorganic powder, (b) a binder and (c) a solvent.

(a) Inorganic Powder

The inorganic powder used in the inorganic powder dispersed paste composition of the present invention differs depending on the type of a material to be formed.

Inorganic powder used in a composition for forming electrodes includes conductive powder such as Ag, Au, Al, Ni, Ag—Pd alloy, Cu and Cr.

Inorganic powder used in a composition for forming barrier ribs includes low-melting glass frit. Illustrative examples of the inorganic powder include (1) a mixture of zinc oxide, boron oxide and silicon oxide ($ZnO$—$B_2O_3$—$SiO_2$ series), (2) a mixture of lead oxide, boron oxide and silicon oxide ($PbO$—$B_2O_3$—$SiO_2$ series), (3) a mixture of lead oxide, boron oxide, silicon oxide and aluminum oxide ($PbO$—$B_2O_3$—$SiO_2$—$Al_2O_3$ series), (4) a mixture of lead oxide, zinc oxide, boron oxide and silicon oxide ($PbO$—$ZnO$—$B_2O_3$—$SiO_2$ series) and the like.

These inorganic powder dispersed paste compositions can be used as a composition for forming a resistor, fluorescent material, color filter or black matrix by changing the type of the inorganic powder.

Inorganic powder used in a composition for forming a resistor includes $RuO_2$ and the like.

Inorganic powder used in a composition for forming a fluorescent material includes $Y_2O_3:Eu^{3+}$, $Y_2SiO_5:Eu^{3+}$, $Y_3Al_5O_{12}:Eu^{3+}$, $YVO_4:Eu^{3+}$, $(Y,Gd)BO_3:Eu^{3+}$, $Zn_3(PO_4)_2:Mn$ and the like for red color, $Zn_2SiO_4:Mn$, $BaAl_{12}O_{19}:Mn$, $BaMgAl_{14}O_{23}:Mn$, $LaPO_4:(Ce,Tb)$, $Y_3(Al,Ga)_5O_{12}:Tb$ and the like for green color, and $Y_2SiO_5:Ce$, $BaMgAl_{10}O_{17}:Eu^{2+}$, $BaMgAl_{14}O_{23}:Eu^{2+}$, $(Ca,Sr,Ba)_{10}(PO_4)_6C_{12}:Eu^{2+}$, $(Zn,Cd)S:Ag$ and the like for blue color.

Inorganic powder used in a composition for forming a color filter includes $Fe_2O_3$, $Pb_3O_4$ and the like for red color, $Cr_2O_3$ and the like for green color, and $2(Al_2Na_2Si_3O_{10}).Na_2S_4)$ and the like for blue color.

Inorganic powder used in a composition for forming a black matrix includes Mn, Fe, Cr and the like.

According to the present invention, the inorganic powder dispersed paste layer is a paste layer in which conductive inorganic powder is dispersed and the formation of electrodes on a substrate for a plasma display panel which are the inorganic material layer pattern formed in the above baking step can be carried out advantageously, or the inorganic powder dispersed paste layer is a paste layer in which glass powder is dispersed and the formation of barrier ribs on a substrate for a plasma display panel which are the inorganic material layer pattern formed in the baking step can be carried out advantageously.

When the electrodes are formed, a paste composition comprising (a-1) conductive powder, (b) an alkali-soluble resin and (c) a solvent is preferably used as the conductive inorganic powder dispersed paste layer and when the barrier ribs are formed, a paste composition comprising (a-2) glass frit, (b) an alkali-soluble resin and (c) a solvent is preferably used as the glass powder dispersed paste layer.

(b) binder

As the binder used in the inorganic powder dispersed paste composition of the present invention may be used various resins. A binder comprising 30 to 100 wt % of an alkali-soluble resin is particularly preferred.

The term "alkali-soluble" used herein means the property of dissolving in an alkaline etching solution which will be described hereinafter and being soluble to such an extent that the intended etching can be carried out.

The alkali-soluble resin used in the binder preferably has a surface tension polar item value of its surface tension of 5 to 20 dyn/cm.

A resin having a surface tension polar item value of the surface tension of less than 5 dyn/cm may show hydrophobic nature and lowered wettability (affinity) for inorganic powder having a hydrophilic surface. When this resin is used, it is difficult to prepare a composition having excellent dispersion stability of inorganic powder and film defects may occur in a film-forming material layer formed of the composition.

On the other hand, a resin having a surface tension polar item value of the surface tension of more than 20 dyn/cm shows high hydrophilic nature and it is difficult to coat an inorganic powder dispersed paste composition containing this resin on a support film having a hydrophobic surface (such as a PET film subjected to a release treatment).

An inorganic powder dispersed paste composition obtained by controlling the surface tension polar item value of the surface tension of the alkali-soluble resin to 5 to 20 dyn/cm has both dispersion stability of inorganic powder and excellent coating properties for the support film.

The surface tension polar item of the surface tension of the alkali-soluble resin can be controlled by changing the type and content of a monomer contained in the resin.

The surface tension (surface tension polar item and dispersion item) of the alkali-soluble resin is preferably in the range of 30 to 50 dyn/cm.

Illustrative examples of the alkali-soluble resin include (meth)acrylic resins, hydroxystyrene resins, novolak resins, polyester resins and the like.

Of these alkali-soluble resins, copolymers of the following monomers (a) and monomers (b) and copolymers of monomers (a), monomers (b) and monomers (c) are particularly preferred.

Monomers (a)

alkali-soluble functional group-containing monomers as typified by carboxyl group-containing monomers such as acrylic acid, methacrylic acid, maleic acid, fumaric acid, crotonic acid, itaconic acid, citraconic acid, mesaconic acid and cinammic acid; hydroxyl group-containing monomers such as 2-hydroxyethyl (meth)acrylate, 2-hydroxypropyl (meth)acrylate and 3-hydroxypropyl (meth)acrylate; phenolic hydroxyl group-containing monomers such as o-hydroxystyrene, m-hydroxystyrene and p-hydroxystyrene; and the like.

Monomers (b)

monomers copolymerizable with monomers (a) as typified by (meth)acrylic acid esters other than the monomers (a) such as methyl (meth)acrylate, ethyl (meth)acrylate, butyl (meth)acrylate, benzyl (meth)acrylate, glycidyl (meth) acrylate and dicyclopentanyl (meth)acrylate; aromatic vinyl monomers such as styrene and α-methylstyrene; conjugated dienes such as butadiene and isoprene; and the like.

Monomers (c)

macromonomers typified by macromonomers having a polymerizable unsaturated group such as (meth)acryloyl group at one terminal of a polymer chain, such as polystyrene, methyl poly(meth)acrylate, ethyl poly(meth) acrylate and benzyl poly(meth)acrylate.

The content of the binder in the inorganic powder dispersed paste composition is generally 1 to 50 parts by weight, preferably 1 to 40 parts by weight, based on 100 parts by weight of inorganic powder.

(c) Solvent

The solvent constituting the inorganic powder dispersed paste composition is contained to provide appropriate fluidity or plasticity and good film-forming properties to the inorganic powder dispersed paste composition.

The solvent constituting the inorganic powder dispersed paste composition is not particularly limited and exemplified by ethers, esters, ether esters, ketones, ketone esters, amides, amide esters, lactams, lactones, sulfoxides, sulfones, hydrocarbons, hydrocarbon halides and the like.

The preferable solvent is required to have (1) a normal boiling point (boiling point at 1 atm) of 100 to 200° C., preferably 110 to 180° C., and (2) a vapor pressure at 20° C. of 0.5 to 50 mmHg, preferably 0.7 to 30 mmHg.

When the normal boiling point is higher than 200° C., the boiling point of the whole solvent contained becomes too high, and when the inorganic powder dispersed paste composition containing this solvent is coated to form a transfer film, an organic solvent remains in the film-forming material layer of the obtained transfer film in large quantities with the result that a blocking phenomenon is liable to occur when the transfer film is kept in the rolled form. On the other hand, when the normal boiling point is lower than 100° C., the boiling point of the whole solvent becomes too low, agglomerates of the inorganic powder are liable to be formed in the inorganic powder dispersed paste composition containing this solvent with the result that film defects such as coating stripes, craters and pin holes are liable to be produced in the film-forming material layer formed by coating the composition.

When the vapor pressure is lower than 0.5 mmHg, the vapor pressure of the whole solvent becomes too low, and when the inorganic powder dispersed paste composition containing this solvent is coated to form a transfer film, an organic solvent remains in the film-forming material layer of the obtained transfer film in large quantities with the result that a blocking phenomenon is liable to occur when the transfer film is kept in the rolled form. On the other hand, when the vapor pressure is higher than 50 mmHg, the vapor pressure of the whole solvent becomes too high, and the inorganic powder dispersed paste composition containing this solvent has quick drying property and poor uniformity in thickness due to insufficient leveling property at the time of coating.

Illustrative examples of the solvent include tetrahydrofuran, anisole, dioxane, ethylene glycol monoalkyl ethers, diethylene glycol dialkyl ethers, propylene glycol monoalkyl ethers, propylene glycol dialkyl ethers, acetic acid esters, hydroxy acetic acid esters, alkoxy acetic acid esters, propionic acid esters, hydroxypropionic acid esters, alkoxypropionic acid esters, lactic acid esters, ethylene glycol monoalkyl ether acetates, propylene glycol monoalkyl ether acetates, alkoxyacetic acid esters, cyclic ketones, non-cyclic ketones, acetoacetic acid esters, pyruvic acid esters, N,N-dialkylformamides, N,N-dialkylacetamides, N-alkylpyrrolidones, γ-lactones, dialkylsulfoxides, dialkylsulfones, terpineol, N-methyl-2-pyrrolidone and the like. They may be used alone or in combination of two or more.

The content of the solvent in the inorganic powder dispersed paste composition can be suitably selected from a range where good film-forming property (fluidity or plasticity) can be obtained.

The inorganic powder dispersed paste composition may contain other additives such as a dispersant, plasticizer, development promoting agent, adhesion aid, halation preventing agent, storage stabilizer, anti-foaming agent, antioxidant, ultraviolet absorber, filler, low-melting glass and the like, as optional component(s).

Particularly, an inorganic powder dispersed paste composition for forming electrodes may contain fatty acid as a dispersant for the above conductive powder. Preferred examples of the fatty acid include saturated fatty acids such as octanoic acid, undecylic acid, lauric acid, myristic acid, palmitic acid, pentadecanoic acid, stearic acid and arachic acid; and unsaturated fatty acids such as elaidic acid, oleic acid, linoleic acid, linolenic acid and arachidonic acid. They may be used alone or in combination of two or more. The content of the fatty acid in the inorganic powder dispersed paste composition is preferably 10 parts or less by weight based on 100 parts by weight of the inorganic powder.

The preferred method for coating the inorganic powder dispersed paste composition on the support film must be capable of forming a coated film having excellent uniformity in thickness and a large thickness (for example, 10 µm or more) efficiently, as exemplified by coating with a roll coater, doctor blade, curtain coater, wire coater and the like.

The surface to be coated with the inorganic powder dispersed paste composition of the support film is preferably subjected to a release treatment. Thereby, the support film can be removed easily in the transfer step which will be described hereinafter.

Coated film drying conditions are, for example, a coating temperature of 50 to 150° C. and a coating time of 0.5 to 30 minutes, and the retention of the solvent after drying (content of the solvent in the inorganic powder dispersed paste layer) is generally 2 wt % or less.

The thickness of the inorganic powder dispersed paste layer thus formed on the support film is generally 10 to 100 μm, though it differs depending on the content of the inorganic powder and the type and size of a material.

The protective film layer which may be formed on the surface of the inorganic powder dispersed paste layer is a polyethylene film, polyvinyl alcohol film or the like.

The following transfer films advantageously used for producing a plasma display panel by the process of the present invention are novel per se and provided by the present invention:

(i) a transfer film for forming electrodes that has a conductive powder dispersed paste layer formed of a paste composition having (a-1) conductive powder, (b) an alkali-soluble resin and (c) a solvent on the support film.

(ii) a transfer film for forming electrodes that has a laminate in which a resist film and a conductive powder dispersed paste layer, which is formed of a paste composition comprising (a-1) conductive powder, (b) an alkali-soluble resin and (c) a solvent, are laminated on the support film in this order.

(iii) a transfer film for forming electrodes that has a laminate in which a resist film, a conductive powder dispersed paste layer formed of a paste composition comprising (a-1) conductive powder, (b) an alkali-soluble resin and (c) a solvent, and a reflection reducing film are laminated on the support film in this order.

(iv) a transfer film for forming barrier ribs that has a glass powder dispersed paste layer formed of a paste composition having (a-2) glass frit, (b) an alkali-soluble resin and (c) a solvent on the support film.

(v) a transfer film for forming barrier ribs that has a laminate in which a resist film and a glass powder dispersed paste layer, which is formed of a paste composition comprising (a-2) glass frit, (b) an alkali-soluble resin and (c) a solvent, are laminated on the support film in this order.

<Resist Film (Resist Composition)>

In the production process of the present invention, a resist film is formed on the inorganic powder dispersed paste layer transferred to the surface of the substrate, and exposed and developed to form a resist pattern on the inorganic powder dispersed paste layer.

A resist composition used to form the resist film is selected from (1) an alkali development type radiation sensitive resist composition, (2) an organic solvent development type radiation sensitive resist composition, (3) an aqueous development type radiation sensitive resist composition, and the like. These resist compositions will be described hereinafter.

(1) Alkali Development Type Radiation Sensitive Resist Composition

The alkali development type radiation sensitive resist composition contains an alkali-soluble resin and a radiation sensitive component as essential ingredients.

Illustrative examples of the alkali-soluble resin constituting the alkali development type radiation sensitive resist composition are the same as those listed for the alkali-soluble resin forming the binder component of the inorganic powder dispersed paste composition.

Preferred examples of the radiation sensitive component constituting the alkali development type radiation sensitive resist composition include (1) a combination of a polyfunctional monomer and a photopolymerization initiator, (2) a combination of a melamine resin and an optically acid-generating agent which form an acid when exposed to radiation, and the like. Of combinations (1), a combination of a polyfunctional (meth)acrylate and a photopolymerization initiator is particularly preferred.

Illustrative examples of the polyfunctional (meth)acrylate forming the radiation sensitive component include di(meth)acrylates of alkylene glycol such as ethylene glycol and propylene glycol; di(meth)acrylates of polyalkylene glycol such as polyethylene glycol and polypropylene glycol; di(meth)acrylates of polymers having hydroxyl groups at both terminals such as both terminal hydroxypolybutadiene, both terminal hydroxypolyisoprene and both terminal hydroxypolycaprolactone; poly(meth)acrylates of polyhydric alcohols having 3 or more hydroxyl groups such as glycerin, 1,2,4-butanetriol, trimethylol alkane, tetramethylol alkane and dipentaerythritol; poly(meth)acrylates of polyalkylene glycol adducts of polyhydric alcohols having 3 or more hydroxyl groups; poly(meth)acrylates of cyclic polyols such as 1,4-cyclohexanediol and 1,4-benzenediol; oligo(meth)acrylates such as polyester (meth)acrylate, epoxy (meth)acrylate, urethane (meth)acrylate, alkyd resin (meth)acrylate, silicone resin (meth)acrylate and spiran resin (meth)acrylate; and the like. They may be used alone or in combination of two or more.

Illustrative examples of the photopolymerization initiator forming the radiation sensitive component include carbonyl compounds such as benzyl, benzoin, benzophenone, camphorquinone, 2-hydroxy-2-methyl-1-phenylpropan-1-one, 1-hydroxycyclohexylphenyl ketone, 2,2-dimethoxy-2-phenylacetophenone, 2-methyl-[4'-(methylthio)phenyl]-2-morpholino-1-propanone and 2-benzyl-2-dimethylamino-1-(4-morpholinophenyl)butan-1-one; azo compounds such as azoisobutyronitrile and azide compounds such as 4-azidobenzaldehyde; organic sulfur compounds such as mercaptan disulfide; organic peroxides such as benzoyl peroxide, di-tert-butyl peroxide, tert-butyl hydroperoxide, cumene hydroperoxide and paramethane hydroperoxide; trihalomethanes such as 1,3-bis(trichloromethyl)-5-(2'-chlorophenyl)-1,3,5-triazine and 2-[2-(2-furanyl)ethylenyl]-4,6-bis(trichloromethyl)-1,3,5-triazine; imidazole dimers such as 2,2'-bis(2-chlorophenyl)4,5,4', 5'-tetraphenyl-1,2'-biimidazole; and the like. They may be used alone or in combination of two or more.

The content of the radiation sensitive component in the alkali development type radiation sensitive resist composition is generally 1 to 300 parts by weight, preferably 10 to 200 parts by weight, based on 100 parts by weight of the alkali-soluble resin.

To provide good film-forming property, an organic solvent is properly contained in the alkali development type radiation sensitive resist composition. Illustrative examples of the organic solvent are the same as those listed for the solvent forming the inorganic powder dispersed paste composition.

(2) Organic Solvent Development Type Radiation Sensitive Resist Composition

The organic solvent development type radiation sensitive resist composition contains an azido compound and at least one member selected from the group consisting of natural rubber, synthetic rubber and cyclized rubber obtained by cyclizing these as essential ingredients.

Illustrative examples of the azido compound forming the organic solvent development type radiation sensitive resist composition include 4,4'-diazidobenzophenone, 4,4'-diazidodiphenyl methane, 4,4'-diazidostilbene, 4,4'-diazidochalcone, 4,4'-diazidobenzalacetone, 2,6-di(4'-azidobenzal)cyclohexanone, 2,6-di(4'-azidobenzal)-4-methylcyclohexanone and the like. These may be used alone or in combination of two or more.

To provide good film-forming property, an organic solvent is generally contained in the organic solvent development type radiation sensitive resist composition. Illustrative examples of the organic solvent are the same as those listed for the solvent forming the inorganic powder dispersed paste composition.

(3) Aqueous Development Type Radiation Sensitive Resist Composition

The aqueous development type radiation sensitive resist composition contains a water-soluble resin such as polyvinyl alcohol and at least one member selected from the group consisting of diazonium compounds and bichromic acid compounds as essential ingredients.

The resist composition used in the production process of the present invention may contain other additives such as a development promoting agent, adhesion aid, halation preventing agent, storage stabilizer, anti-foaming agent, antioxidant, ultraviolet absorber, filler, fluorescent material, pigment and dye, as optional component(s).

<Exposure Mask>

The exposure pattern of the exposure mask M used in the step of exposing a resist film, which differs depending on materials, is generally a stripe pattern having a stripe width of 10 to 500 μm.

<Developer>

The developer used in the step of developing a resist film can be suitably selected according to the type of a resist film (resist composition). Stated more specifically, an alkali developer can be used for a resist film formed from an alkali development type radiation sensitive resist composition, an organic solvent developer for a resist film formed from an organic solvent development type radiation sensitive resist composition and an aqueous developer for a resist film formed from an aqueous development type radiation sensitive resist composition.

The effective component of the alkali developer is an alkaline inorganic compound such as lithium hydroxide, sodium hydroxide, potassium hydroxide, sodium hydrogen phosphate, diammonium hydrogen phosphate, dipotassium hydrogen phosphate, disodium hydrogen phosphate, ammonium dihydrogen phosphate, potassium dihydrogen phosphate, sodium dihydrogen phosphate, lithium silicate, sodium silicate, potassium silicate, lithium carbonate, sodium carbonate, potassium carbonate, lithium borate, sodium borate, potassium borate, ammonia or the like; and an alkaline organic compound such as tetramethyl ammonium hydroxide, trimethyl hydroxyethyl ammonium hydroxide, monomethylamine, dimethylamine, trimethylamine, monoethylamine, diethylamine, triethylamine, monoisopropylamine, diisopropylamine, ethanolamine or the like.

The alkali developer used in the step of developing a resist film can be prepared by dissolving one or more of the above alkaline compounds in water. The concentration of the alkaline compound in the alkali developer is generally 0.001 to 10 wt %, preferably 0.01 to 5 wt %. After development with the alkali developer, washing with water is generally carried out.

Illustrative examples of the organic solvent developer include organic solvents such as toluene, xylene and butyl acetate. They may be used alone or in combination of two or more. After development with an organic solvent developer, rinsing with a poor solvent is carried out as required.

Illustrative examples of the aqueous developer include water, alcohol and the like.

<Etching Solution>

The etching solution used in the step of etching an inorganic powder dispersed paste layer is preferably an alkaline solution. Thereby, the alkali-soluble resin contained in the inorganic powder dispersed paste layer can be dissolved and removed easily.

Since the inorganic powder contained in the inorganic powder dispersed paste layer are uniformly dispersed in the alkali-soluble resin, the alkali-soluble resin which is a binder is dissolved in an alkaline solution and washed, whereby the inorganic powder is removed at the same time.

The alkaline solution used as an etching solution may be a solution having the same composition as the developer.

When the etching solution has the same composition as the alkali developer used in the development step, the development step and the etching step can be carried out continuously with the result of improved production efficiency due to the simplification of the process.

After etching with an alkaline solution, washing with water is generally carried out.

As the etching solution may also be used an organic solvent capable of dissolving the binder of the inorganic powder dispersed paste layer. Illustrative examples of the organic solvent are the same as those listed for the solvent forming the inorganic powder dispersed paste composition.

After etching with an organic solvent, rinsing with a poor solvent is carried out as required.

The following examples are provided for the purpose of further illustrating the present invention but are in no way to be taken as limiting. In the following examples, "parts" and "%" mean "parts by weight" and "% by weight (wt %)", respectively.

The weight average molecular weight (Mw) is an average molecular weight in terms of styrene measured by gel permeation chromatography (GPC) (trade name: HLC-802A of Tosoh Corporation).

Synthesis Example 1

A monomer composition comprising 200 parts of N-methyl-2-pyrrolidone, 70 parts of n-butyl methacrylate, 30 parts of methacrylic acid and 1 part of azobisisobutyronitrile was charged into an autoclave equipped with a stirrer, stirred uniformly at room temperature in a nitrogen atmosphere and polymerized at 80° C. for 3 hours. The polymerization reaction was further continued at 100° C. for 1 hour, and the temperature was then reduced to room temperature to give a polymer solution. The polymerization conversion was 98% and the weight average molecular weight (Mw) of a copolymer (to be referred to as "polymer (A)" hereinafter) separated out from the polymer solution was 70,000.

Synthesis Example 2

A polymer solution was obtained in the same manner as in Synthesis Example 1 except that a monomer composition comprising 200 parts of N-methyl-2-pyrrolidone, 80 parts of n-butyl methacrylate, 20 parts of methacrylic acid and 1 part of azobisisobutyronitrile was charged into an autoclave. The polymerization conversion was 97% and the weight average molecular weight (Mw) of a copolymer (to be referred to as "polymer (B)" hereinafter) separated out from the polymer solution was 100,000.

Synthesis Example 3

A polymer solution was obtained in the same manner as in Synthesis Example 1 except that a monomer composition comprising 200 parts of N-methyl-2-pyrrolidone, 90 parts of n-butyl methacrylate, 10 parts of methacrylic acid and 1 part of azobisisobutyronitrile was charged into an autoclave. The polymerization conversion was 97% and the weight average molecular weight (Mw) of a copolymer (to be referred to as "polymer (C)" hereinafter) separated out from the polymer solution was 90,000.

Synthesis Example 4

A polymer solution was obtained in the same manner as in Synthesis Example 1 except that a monomer composition comprising 200 parts of ethyl 3-ethoxypropionate, 85 parts of n-butyl methacrylate, 15 parts of methacrylic acid and 1 part of azobisisobutyronitrile was charged into an autoclave. The polymerization conversion was 98% and the weight average molecular weight (Mw) of a copolymer (to be referred to as "polymer (D)" hereinafter) separated out from the polymer solution was 50,000.

Preparation Example 1
(Formation of Transfer Film for Forming Electrodes)

750 Parts by silver powder as inorganic powder, 150 parts of the polymer (A) as an alkali-soluble resin, 20 parts of polypropylene glycol [molecular weight of 400, manufactured by Wako Pure Chemical Industries, Ltd.] as a plasticizer an 400 parts of N-methyl-2-pyrrolidone as a solvent were kneaded together to prepare an inorganic powder dispersed paste composition for forming electrodes [to be referred to as "inorganic powder dispersed paste composition (I-1)" hereinafter].

Thereafter, the obtained inorganic powder dispersed paste composition (I-1) was coated on a polyethylene terephthalate (PET) support film (a width of 200 mm, a length of 30 m and a thickness of 38 $\mu$m) that had been subjected to a release treatment with a roll coater to form a coated film. The formed coated film was dried at 110° C. for 5 minutes to remove the solvent completely, whereby a transfer film [to be referred to as "transfer film (I-1)" hereinafter] having a 10 $\mu$m-thick inorganic powder dispersed paste layer for forming electrodes [to be referred to as "inorganic powder dispersed paste layer (I-1)" hereinafter] formed on the support film was prepared.

Preparation Example 2
(Formation of Transfer Film for Forming Electrodes)

750 Parts by silver powder as inorganic powder, 150 parts of the polymer (B) as an alkali-soluble resin, 20 parts of polypropylene glycol [molecular weight of 400, manufactured by Wako Pure Chemical Industries, Ltd.] as a plasticizer and 400 parts of N-methyl-2-pyrrolidone as a solvent were kneaded together to prepare an inorganic powder dispersed paste composition for forming electrodes [to be referred to as "inorganic powder dispersed paste composition (I-2)" hereinafter].

A transfer film [to be referred to as "transfer film (I-2)" hereinafter] having a 10 $\mu$m-thick inorganic powder dispersed paste layer for forming electrodes [to be referred to as "inorganic powder dispersed paste layer (I-2)" hereinafter] formed on the support film was prepared by coating the inorganic powder dispersed paste composition and removing the solvent completely in the same manner as in Preparation Example 1 except that the obtained inorganic powder dispersed paste composition (I-2) was used.

Preparation Example 3
(Formation of Transfer Film for Forming Barrier Ribs)

750 Parts of lead borosilicate glass frit (PbO—$B_2O_3$—$SiO_2$-series mixture, softening point: 540° C., this shall be applied to the following description) as inorganic powder, 150 parts of the polymer (A) as an alkali-soluble resin, 20 parts of polypropylene glycol [molecular weight of 400, manufactured by Wako Pure Chemical Industries, Ltd.] as a plasticizer and 400 parts of N-methyl-2-pyrrolidone as a solvent were kneaded together to prepare an inorganic powder dispersed paste composition for forming barrier ribs [to be referred to as "inorganic powder dispersed paste composition (II-1)" hereinafter].

A transfer film [to be referred to as "transfer film (II-1)" hereinafter] having a 40 $\mu$m-thick inorganic powder dispersed paste layer for forming barrier ribs [to be referred to as "inorganic powder dispersed paste layer (II-1)" hereinafter] formed on the support film was prepared by coating the inorganic powder dispersed paste composition and removing the solvent completely in the same manner as in Preparation Example 1 except that the obtained inorganic powder dispersed paste composition (II-1) was used.

Preparation Example 4
(Formation of Transfer Film for Forming Barrier Ribs)

1,000 Parts of lead borosilicate glass frit as inorganic powder, 150 parts of the polymer (B) as an alkali-soluble resin, 20 parts of polypropylene glycol [molecular weight of 400, manufactured by Wako Pure Chemical Industries, Ltd.] as a plasticizer and 400 parts of N-methyl-2-pyrrolidone as a solvent were kneaded together to prepare an inorganic powder dispersed paste composition for forming barrier ribs [to be referred to as "inorganic powder dispersed paste composition (II-2)" hereinafter].

A transfer film [to be referred to as "transfer film (II-2)" hereinafter] having a 40 $\mu$m-thick inorganic powder dispersed paste layer for forming barrier ribs [to be referred to as "inorganic powder dispersed paste layer (II-2)" hereinafter] formed on the support film was prepared by coating the inorganic powder dispersed paste composition and removing the solvent completely in the same manner as in Preparation Example 1 except that the obtained inorganic powder dispersed paste composition (II-2) was used.

Preparation Example 5
(Formation of Transfer Film for Forming Barrier Ribs)

750 Parts of lead borosilicate glass frit as inorganic powder, 150 parts of the polymer (B) as an alkali-soluble resin, 20 parts of polypropylene glycol [molecular weight of 400, manufactured by Wako Pure Chemical Industries, Ltd.] as a plasticizer and 400 parts of N-methyl-2-pyrrolidone as a solvent were kneaded together to prepare an inorganic powder dispersed paste composition for forming barrier ribs [to be referred to as "inorganic powder dispersed paste composition (II-3)" hereinafter].

A transfer film [to be referred to as "transfer film (II-3)" hereinafter] having a 40 $\mu$m-thick inorganic powder dispersed paste layer for forming barrier ribs [to be referred to as "inorganic powder dispersed paste layer (II-3)" hereinafter] formed on the support film was prepared by coating the inorganic powder dispersed paste composition and removing the solvent completely in the same manner as in Preparation Example 1 except that the obtained inorganic powder dispersed paste composition (II-3) was used.

Preparation Example 6
(Formation of Transfer Film for Forming Barrier Ribs)

1,000 Parts of lead borosilicate glass frit as inorganic powder, 150 parts of the polymer (C) as an alkali-soluble resin, 20 parts of polypropylene glycol [molecular weight of 400, manufactured by Wako Pure Chemical Industries, Ltd.] as a plasticizer and 400 parts of N-methyl-2-pyrrolidone as a solvent were kneaded together to prepare an inorganic powder dispersed paste composition for forming barrier ribs [to be referred to as "inorganic powder dispersed paste composition (II-4)" hereinafter].

A transfer film [to be referred to as "transfer film (II-4)" hereinafter] having a 40 μm-thick inorganic powder dispersed paste layer for forming barrier ribs [to be referred to as "inorganic powder dispersed paste layer (II-4)" hereinafter] formed on the support film was prepared by coating the inorganic powder dispersed paste composition and removing the solvent completely in the same manner as in Preparation Example 1 except that the obtained inorganic powder dispersed paste composition (II-4) was used.

Preparation Example 7

750 Parts of lead borosilicate glass frit as inorganic powder, 150 parts of the polymer (C) as an alkali-soluble resin, 20 parts of polypropylene glycol [molecular weight of 400, manufactured by Wako Pure Chemical Industries, Ltd.] as a plasticizer and 400 parts of N-methyl-2-pyrrolidone as a solvent were kneaded together to prepare an inorganic powder dispersed paste composition for forming barrier ribs [to be referred to as "inorganic powder dispersed paste composition (II-5)" hereinafter].

A transfer film [to be referred to as "transfer film (II-5)" hereinafter] having a 40 μm-thick inorganic powder dispersed paste layer for forming barrier ribs [to be referred to as "inorganic powder dispersed paste layer (II-5)" hereinafter] formed on the support film was prepared by coating the inorganic powder dispersed paste composition and removing the solvent completely in the same manner as in Preparation Example 1 except that the obtained inorganic powder dispersed paste composition (II-5) was used.

Solubility of Inorganic Powder Dispersed Paste Layer for Forming Barrier Ribs

The solubility of each of the inorganic powder dispersed paste layers for forming barrier ribs (II-1) to (II-5) of the Preparation Examples 3 to 7 in a 0.2 wt % aqueous solution of potassium hydroxide was evaluated. The evaluation method is as follows, and evaluation results are shown in Table 1 below.

(Evaluation Method)

Each of the inorganic powder dispersed paste compositions was coated on the surface of a soda glass substrate (5 cm square and 1.1 mm thick) with a bar coater and dried at 110° C. for 5 minutes to remove the solvent completely to prepare a test piece having a 40 μm-thick inorganic powder dispersed paste layer.

The obtained test piece was immersed in a 0.2 wt % aqueous solution of potassium hydroxide and the surface of the test piece was observed while the solution was stirred with a magnetic stirrer. The time elapsed before half of the surface of the substrate was exposed by the dissolution of the inorganic powder dispersed paste layer on the surface of the test piece was measured as a dissolution time and the dissolution speed was calculated based on the following equation.

equation: dissolution speed (μm/sec)=film thickness (μm)/dissolution time (sec)

TABLE 1

| inorganic powder dispersed paste layer | film thickness (μm) | dissolution time (sec) | dissolution speed (μm/sec) |
| --- | --- | --- | --- |
| II-1 | 40 | 30 | 1.33 |
| II-2 | 40 | 46 | 0.87 |
| II-3 | 40 | 62 | 0.65 |
| II-4 | 40 | 74 | 0.54 |
| II-5 | 40 | 88 | 0.45 |

Preparation Example 8
(Formation of Transfer Film for Forming Resist Film)

50 Parts of the polymer (C) as an alkali-soluble resin, 40 parts of pentaerythritol tetraacrylate as a polyfunctional monomer (radiation sensitive component), 5 parts of 2-benzyl-2-dimethylamino-1-(4-morpholinophenyl)-butan-1-one as a photopolymerization initiator (radiation sensitive component) and 150 parts of ethyl 3-ethoxypropionate as a solvent were kneaded together to prepare an alkali development type radiation sensitive resist composition in the form of a paste.

A coated film was formed by coating a polyethylene terephthalate (PET) support film (a width of 200 mm, a length of 30 m and a thickness of 38 μm) that had been subjected to a release treatment with the obtained resist composition by the use of a roll coater. The formed coated film was dried at 110° C. for 5 minutes to remove the solvent completely, whereby a transfer film [to be referred to as "transfer film (R-1)" hereinafter] having a 5 μm-thick resist film [to be referred to as "resist film (1)" hereinafter] formed on the support film was prepared.

Preparation Example 9
(Formation of Transfer Film for Forming Resist Film)

50 Parts of the polymer (D) as an alkali-soluble resin, 40 parts of pentaerythritol tetraacrylate as a polyfunctional monomer (radiation sensitive component), 5 parts of 2-benzyl-2-dimethylamino-1-(4-morpholinophenyl)-butan-1-one as a photopolymerization initiator (radiation sensitive component) and 150 parts of ethyl 3-ethoxypropionate as a solvent were kneaded together to prepare an alkali development type radiation sensitive resist composition in the form of a paste.

A coated film was formed by coating a polyethylene terephthalate (PET) support film (a width of 200 mm, a length of 30 m and a thickness of 38 μm) that had been subjected to a release treatment with the obtained resist composition by the use of a roll coater. The formed coated film was dried at 110° C. for 5 minutes to remove the solvent completely, whereby a transfer film [to be referred to as "transfer film (R-2)" hereinafter] having a 10 μm-thick resist film [to be referred to as "resist film (2)" hereinafter] formed on the support film was prepared.

EXAMPLE 1
[Step of Transferring Inorganic Powder Dispersed Paste Layer]

The transfer film [I-1] was placed upon a glass substrate for a 6-inch panel in such a manner that the surface of the inorganic powder dispersed paste layer (I-1) for forming electrodes came into contact with the surface of the glass substrate, and the transfer film [I-1] was press-bonded to the glass substrate by a heating roller. Press-bonding conditions are a heating roller surface temperature of 120° C., a roll pressure of 4 kg/cm² and a heating roller roll moving speed of 0.5 m/min. After the above press-bonding treatment, the support film was removed from the inorganic powder dispersed paste layer (I-1). Thereby, the inorganic powder dispersed paste layer (I-1) was transferred and closely bonded to the surface of the glass substrate. When the thickness of this inorganic powder dispersed paste layer was measured, it was 10 µm±1 µm.

Thereafter, the transfer film (I-2) was placed upon the inorganic powder dispersed paste layer (I-1) in such a manner that the surface of the inorganic powder dispersed paste layer (I-2) came into contact with the surface of the inorganic powder dispersed paste layer (I-1), and the transfer film (I-2) was press-bonded by a heating roller under the same press-bonding conditions as described above. After the above press-bonding treatment, the support film was removed from the inorganic powder dispersed paste layer (I-2). Thereby, the inorganic powder dispersed paste layer (I-2) was transferred and closely bonded to the surface of the inorganic powder dispersed paste layer (I-1)). When the thickness of the laminate consisting of the inorganic powder dispersed paste layers (I-1) and (I-2) formed on the glass substrate was measured, it was 20 µm±2 µm.

[Step of Forming Resist Film]

The transfer film (R-1) was placed upon the inorganic powder dispersed paste layer (I-2) in such a manner that the surface of the resist film (1) came into contact with the surface of the inorganic powder dispersed paste layer (I-2), and the transfer film (R-1) was press-bonded by a heating roller under the same press-bonding conditions as described above. After the above press-bonding treatment, the support film was removed from the resist film (1). Thereby, the resist film (1) was transferred and closely bonded to the surface of the inorganic powder dispersed paste layer (I-2). When the thickness of the resist film (1) transferred to the surface of the inorganic powder dispersed paste layer (I-2) was measured, it was 5 µm±1 µm.

[Step of Exposing Resist Film]

The resist film (1) formed on the laminate of the inorganic powder dispersed paste layers was exposed to an i-line (ultraviolet light having a wavelength of 365 nm) by an ultra high-pressure mercury lamp through an exposure mask (stripe pattern having a width of 70 µm). The amount of irradiation was 400 mJ/cm$^2$.

[Step of Developing Resist Film]

The exposed resist film (1) was developed with a 0.2 wt % aqueous solution of potassium hydroxide (25° C.) as a developer by a shower method for 20 seconds. Then, the resist film was washed with ultra-pure water to remove unexposed uncured resist so as to form a resist pattern.

[Step of Etching Inorganic Powder Dispersed Paste Layer]

Without a break after the above step, etching was carried out with a 0.2 wt % aqueous solution of potassium hydroxide (25° C.) as an etching solution by a shower method for 2 minutes. Thereafter, washing treatment with ultra-pure water and drying treatment were carried out. Thereby, an inorganic powder dispersed paste layer pattern consisting of material layer remaining portions and material layer removed portions was formed.

[Step of Baking Inorganic Powder Dispersed Paste Layer]

The glass substrate having the above inorganic powder dispersed paste layer pattern was baked in a firing furnace at 60° C. for 30 minutes. A panel material having electrodes formed on the surface of the glass substrate was thereby obtained.

When the cross section of the electrode of the obtained panel material was observed by a scanning electron microscope to measure the width and height of the bottom face of the cross section, the width of the bottom face was 50 µm±2 µm and the height was 10 µm±1 µm. Thus, dimensional accuracy was very high.

EXAMPLE 2

[Formation of Transfer Film]

A transfer film having a laminate consisting of two inorganic powder dispersed paste layers for forming electrodes and a resist film formed on a support film was prepared by the following operations (1) to (3). (1) A 5 µm-thick resist film [to be referred to as "resist film (1')" hereinafter] was formed on the support film by coating a PET support film (a width of 200 mm, a length of 30 m and a thickness of 38 µm) that had been subjected to a release treatment with the resist composition used in Preparation Example 8 by the use of a roll coater and drying the coated film at 110° C. for 5 minutes to remove the solvent completely.

(2) A 10 µm-thick inorganic powder dispersed paste layer for forming electrodes [to be referred to as "inorganic powder dispersed paste layer (I-2')" hereinafter] was formed on the resist film (1') by coating the resist film (1') with the inorganic powder dispersed paste composition (I-2) by the use of a roll coater and drying the coated film at 110° C. for 5 minutes to remove the solvent completely.

(3) A 10 µm-thick inorganic powder dispersed paste layer [to be referred to as "inorganic powder dispersed paste layer (I-1')" hereinafter] was formed on the inorganic powder dispersed paste layer (I-2') by coating the inorganic powder dispersed paste layer (I-2') with the inorganic powder dispersed paste composition (I-1) by the use of a roll coater and drying the coated film at 110° C. for 5 minutes to remove the solvent completely.

[Step of Transferring Laminate Film]

The transfer film was placed upon the same glass substrate as used in Example 1 in such a manner that the surface of the inorganic powder dispersed paste layer (I-1') came into contact with the surface of the glass substrate, and the transfer film was press-bonded by a heating roller. Press-bonding conditions are a heating roller surface temperature of 120° C., a roll pressure of 4 kg/cm$^2$ and a heating roll moving speed of 0.5 m/min. After the above press-bonding treatment, the support film was removed from the laminate film [surface of the resist film (1')]. Thereby, the laminate film was transferred and closely bonded to the surface of the glass substrate. When the thickness of this laminate film [laminate film consisting of two inorganic powder dispersed paste layers and the resist film] was measured, it was 25 µm±2 µm.

[Step of Exposing and Developing Resist Film]

A resist pattern was formed on the laminate of the inorganic powder dispersed paste layers by exposing (to ultraviolet light), developing with an aqueous solution of potassium hydroxide and washing with water the resist film (1') formed on the laminate of the inorganic powder dispersed paste layers under the same conditions as in Example 1.

[Step of Etching Inorganic Powder Dispersed Paste Layer]

Without a break after the above step, etching with an aqueous solution of potassium hydroxide, washing with water and drying were carried out under the same conditions as in Example 1 to form an inorganic powder dispersed paste layer pattern.

[Step of Baking Inorganic Powder Dispersed Paste Layer Pattern]

The glass substrate having an inorganic powder dispersed paste layer pattern was baked in a firing furnace at 600° C. for 30 minutes. A panel material having electrodes formed on the surface of the glass substrate was thereby obtained.

When the cross section of the electrode of the obtained panel material was observed by a scanning electron microscope to measure the width and height of the bottom face of the cross section, the width of the bottom face was 50 $\mu$m±2 $\mu$m and the height was 10 $\mu$m±1 $\mu$m. Thus, dimensional accuracy was very high.

EXAMPLE 3

[Step of Transferring Inorganic Powder Dispersed Paste Layer]

The transfer film (II-1) was placed upon a glass substrate for a 6-inch panel, which has been arranged with electrodes (width of 100 $\mu$m) for generating plasma, in such a manner that the surface of the inorganic powder dispersed paste layer (II-1) came into contact with the surface of the glass substrate, and the transfer film (II-1) was press-bonded by a heating roller. Press-bonding conditions are a heating roller surface temperature of 120° C., a roll pressure of 4 kg/cm$^2$ and a heating roll moving speed of 0.5 m/min. After the above press-bonding treatment, the support film was removed from the inorganic powder dispersed paste layer (II-1). Thereby, the inorganic powder dispersed paste layer (II-1) was transferred and closely bonded to the surface of the glass substrate. When the thickness of the inorganic powder dispersed paste layer (II-1) was measured, it was 40 $\mu$m±1 $\mu$m.

Then, the transfer film (II-2) was placed upon the inorganic powder dispersed paste layer (II-1) in such a manner that the surface of the inorganic powder dispersed paste layer (II-2) came into contact with the surface of the inorganic powder dispersed paste layer (II-1), and the transfer film (II-2) was press-bonded by a heating roller under the same press-bonding conditions as described above. After the above press-bonding treatment, the support film was removed from the inorganic powder dispersed paste layer (II-2). Thereby, the inorganic powder dispersed paste layer (II-2) was transferred and closely bonded to the surface of the inorganic powder dispersed paste layer (II-1).

When the thickness of the laminate of the inorganic powder dispersed paste layers (II-1) and (II-2) formed on the glass substrate was measured, it was 80 $\mu$m±2 $\mu$m.

Thereafter, the transfer film (II-3) was placed upon the inorganic powder dispersed paste layer (II-2) in such a manner that the surface of the inorganic powder dispersed paste layer (II-3) came into contact with the surface of the inorganic powder dispersed paste layer (II-2), and the transfer film (II-3) was press-bonded by a heating roller under the same press-bonding conditions as described above. After the above press-bonding treatment, the support film was removed from the inorganic powder dispersed paste layer (II-3). Thereby, the inorganic powder dispersed paste layer (II-3) was transferred and closely bonded to the surface of the inorganic powder dispersed paste layer (II-2).

When the thickness of the laminate of the inorganic powder dispersed paste layers (II-1) to (II-3) formed on the glass substrate was measured, it was 120 $\mu$m±3 $\mu$m.

Thereafter, the transfer film (II-4) was placed upon the inorganic powder dispersed paste layer (II-3) in such a manner that the surface of the inorganic powder dispersed paste layer (II-4) came into contact with the surface of the inorganic powder dispersed paste layer (II-3), and the transfer film (II-4) was press-bonded by a heating roller under the same press-bonding conditions as described above. After the above press-bonding treatment, the support film was removed from the inorganic powder dispersed paste layer (II-4). Thereby, the inorganic powder dispersed paste layer (II-4) was transferred and closely bonded to the surface of the inorganic powder dispersed paste layer (II-3).

When the thickness of the laminate of the inorganic powder dispersed paste layers (II-1) to (II-4) formed on the glass substrate was measured, it was 160 $\mu$m±4 $\mu$m.

Thereafter, the transfer film (II-5) was placed upon the inorganic powder dispersed paste layer (II-4) in such a manner that the surface of the inorganic powder dispersed paste layer (II-5) came into contact with the surface of the inorganic powder dispersed paste layer (II-4), and the transfer film (II-5) was press-bonded by a heating roller under the same press-bonding conditions as described above. After the above press-bonding treatment, the support film was removed from the inorganic powder dispersed paste layer (II-5). Thereby, the inorganic powder dispersed paste layer (II-5) was transferred and closely bonded to the surface of the inorganic powder dispersed paste layer (II-4). When the thickness of the laminate of the inorganic powder dispersed paste layers (II-1) to (II-5) formed on the glass substrate was measured, it was 200 $\mu$m±5 $\mu$m.

[Step of Forming Resist Film]

The transfer film (R-2) was placed upon the inorganic powder dispersed paste layer (II-5) in such a manner that the surface of the resist film (2) came into contact with the surface of the inorganic powder dispersed paste layer (II-5), and the transfer film (R-2) was press-bonded by a heating roller under the same press-bonding conditions as described above. After the above press-bonding treatment, the support film was removed from the resist film (2). Thereby, the resist film (2) was transferred and closely bonded to the surface of the inorganic powder dispersed paste layer (II-5).

When the thickness of the resist film (2) transferred to the surface of the inorganic powder dispersed paste layer (II-5) was measured, it was 10 $\mu$m±1 $\mu$m.

[Step of Exposing Resist Film]

The resist film (2) formed on the laminate of the inorganic powder dispersed paste layers was exposed to an i-line (ultraviolet light having a wavelength of 365 nm) by an ultra high-pressure mercury lamp through an exposure mask (stripe pattern having a width of 50 $\mu$m). The amount of irradiation was 400 mJ/cm$^2$.

[Step of Developing Resist Film]

The exposed resist film (2) was developed with a 0.2 wt % aqueous solution of potassium hydroxide (25° C.) as a developer by a shower method for 30 seconds. Then, the resist film was washed with ultra-pure water to remove unexposed uncured resist so as to form a resist pattern.

[Step of Etching Inorganic Powder Dispersed Paste Layer]

Without a break after the above step, etching was carried out with a 0.2 wt % aqueous solution of potassium hydroxide (25° C.) as an etching solution by a shower method for 5 minutes.

Thereafter, washing treatment with ultra-pure water and drying treatment were carried out. Thereby, an inorganic powder dispersed paste layer pattern consisting of material layer remaining portions and material layer removed portions was formed.

[Step of Baking Inorganic Powder Dispersed Paste Layer]

The glass substrate having the above inorganic powder dispersed paste layer pattern formed thereon was heated in a clean oven at 180° C. This glass substrate was then transferred in a firing furnace and baked at 520° C. for 30 minutes. A panel material having barrier ribs (glass sintered body) on the surface of the glass substrate was thereby obtained.

When the cross section of the barrier rib of the obtained panel material was observed by a scanning electron microscope to measure the width and height of the bottom face of the cross section, the width of the bottom face was 50 $\mu$m±3

μm and the height was 150 μm±4 μm. Thus, the dimensional accuracy of the barrier rib was very high and the aspect ratio was as high as 3.

A plasma display panel was manufactured using this panel material in accordance with a commonly used method. This plasma display panel had high brightness at fluorescent sites and displayed high-quality color images.

EXAMPLE 4

[Formation of Transfer Film]

A transfer film having a laminate film consisting of five inorganic powder dispersed paste layers and a resist film formed on a support film was prepared by the following operations (1) to (6).

(1) A 10 μm-thick resist film [to be referred to as "resist film (2')" hereinafter] was formed on the support film by coating a PET support film (a width of 200 mm, a length of 30 m and a thickness of 38 μm) that had been subjected to a release treatment with the resist composition used in Preparation Example 9 by the use of a roll coater and drying the coated film at 110° C. for 5 minutes to remove the solvent completely.

(2) A 40 μm-thick inorganic powder dispersed paste layer [to be referred to as "inorganic powder dispersed paste layer (II-5')" hereinafter] was formed on the resist film (2') by coating the resist film (2') with the inorganic powder dispersed paste composition (II-5) by the use of a roll coater and drying the coated film at 110° C. for 5 minutes to remove the solvent completely.

(3) A 40 μm-thick inorganic powder dispersed paste layer [to be referred to as "inorganic powder dispersed paste layer (II-4')" hereinafter] was formed on the inorganic powder dispersed paste layer (II-5') by coating the inorganic powder dispersed paste layer (II-5') with the inorganic powder dispersed paste composition (II-4) by the use of a roll coater and drying the coated film at 110° C. for 5 minutes to remove the solvent completely.

(4) A 40 μm-thick inorganic powder dispersed paste layer [to be referred to as "inorganic powder dispersed paste layer (II-3')" hereinafter] was formed on the inorganic powder dispersed paste layer (II-4') by coating the inorganic powder dispersed paste layer (II-4') with the inorganic powder dispersed paste composition (II-3) by the use of a roll coater and drying the coated film at 110° C. for 5 minutes to remove the solvent completely.

(5) A 40 μm-thick inorganic powder dispersed paste layer [to be referred to as "inorganic powder dispersed paste layer (II-2')" hereinafter] was formed on the inorganic powder dispersed paste layer (II-3') by coating the inorganic powder dispersed paste layer (II-3') with the inorganic powder dispersed paste composition (II-2) by the use of a roll coater and drying the coated film at 110° C. for 5 minutes to remove the solvent completely.

(6) A 40 μm-thick inorganic powder dispersed paste layer [to be referred to as "inorganic powder dispersed paste layer (II-1')" hereinafter] was formed on the inorganic powder dispersed paste layer (II-2') by coating the inorganic powder dispersed paste layer (II-2') with the inorganic powder dispersed paste composition (II-1) by the use of a roll coater and drying the coated film at 110° C. for 5 minutes to remove the solvent completely.

[Step of Transferring Laminate Film]

The transfer film was placed upon the same glass substrate as used in Example 3 in such a manner that the surface of the inorganic powder dispersed paste layer (1') came into contact with the surface of the glass substrate, and the transfer film was press-bonded by a heating roller. Press-bonding conditions are a heating roller surface temperature of 100° C., a roll pressure of 3 kg/cm² and a heating roll moving speed of 0.5 m/min. After the above press-bonding treatment, the support film was removed from the laminate film [surface of the resist film (2')]. Thereby, the laminate film was transferred and closely bonded to the surface of the glass substrate. When the thickness of this laminate film [laminate film consisting of five inorganic powder dispersed paste layers and the resist film] was measured, it was 210 μm±6 μm.

[Step of Exposing and Developing Resist Film]

A resist pattern was formed on the laminate of the inorganic powder dispersed paste layers by exposing (to ultraviolet light), developing with an aqueous solution of potassium hydroxide and washing with water the resist film (2') formed on the laminate of the inorganic powder dispersed paste layers under the same conditions as in Example 1.

[Step of Etching Inorganic Powder Dispersed Paste Layers]

Without a break after the above step, an inorganic powder dispersed paste layer pattern was formed by etching with an aqueous solution of potassium hydroxide, washing with water and drying the laminate of the inorganic powder dispersed paste layers under the same conditions as in Example 3.

[Step of Baking Inorganic Powder Dispersed Paste Layer Pattern]

The glass substrate having an inorganic powder dispersed paste layer pattern formed thereon was heated in a clean oven at 180° C. for 30 minutes. Thereafter, this glass substrate was transferred in a firing furnace and baked at 520° C. for 30 minutes to give a panel material having barrier ribs (glass sintered body) formed on the surface of the glass substrate.

When the cross section of the barrier rib of the obtained panel material was observed by a scanning electron microscope to measure the width and height of the bottom face of the cross section, the width of the bottom face was 50 μm±3 μm and the height was 150 μm±4 μm. Thus, the dimensional accuracy of the barrier rib was very high and the aspect ratio was as high as 3.

A plasma display panel was manufactured using this panel material in accordance with a commonly used method. This plasma display panel had high brightness at fluorescent sites and displayed high-quality color images.

What is claimed is:

1. A process for forming electrodes on a substrate, which comprises:

(1) transferring a conductive inorganic powder dispersed paste layer supported on a support film to the surface of a substrate to form a conductive inorganic powder dispersed paste layer on said substrate;

(2) forming a resist film on said conductive inorganic powder dispersed paste layer transferred to the surface of said substrate;

(3) exposing said resist film to light through a mask to form a latent image of a resist pattern;

(4) developing the exposed resist film to form a resist pattern;

(5) etching exposed portions of said conductive inorganic powder dispersed paste layer to form a conductive inorganic powder dispersed paste layer pattern corresponding to said resist pattern and to remove said resist pattern; and (6) baking said conductive inorganic powder dispersed paste layer pattern to calcine organic substance contained therein to form electrodes.

2. The process of claim 1, wherein said conductive inorganic powder dispersed paste layer is formed by coating said support film with a paste composition comprising (a-1) conductive powder, (b) an alkali-soluble resin and (c) a solvent and drying the coated film to remove pair or all of the solvent.

3. The process of claim 1, wherein the formation of said resist film in step (2) is carried out by transferring a resist film supported on a support film to the surface of said conductive inorganic powder dispersed paste layer.

4. The process of claim 1, wherein said conductive inorganic powder dispersed paste layer formed on said substrate in step (1) is a laminate of a plurality of said conductive inorganic powder dispersed paste layers.

5. The process of claim 1, wherein a single conductive inorganic powder dispersed paste layer supported on said support film is transferred 2 to 10 times in step (1) to form a laminate of 2 to 10 conductive inorganic powder dispersed paste layers on said substrate.

6. The process of claim 1, wherein a laminate of 2 to 10 conductive inorganic powder dispersed paste layers supported on said support film is transferred to the surface of said substrate in step (1) to form a laminate of 2 to 10 conductive inorganic powder dispersed paste layers on said substrate.

7. The process of claim 1, wherein a reflection reducing film is formed on or under said conductive inorganic powder dispersed paste layer.

8. A process for forming electrodes on a substrate for a plasma display panel, which comprises:

(1) transferring a laminate film, in which a resist film and a conductive inorganic powder dispersed paste layer are laminated and supported on a support film in this order, to the surface of a substrate to form on said substrate a laminate film in which said conductive inorganic powder dispersed paste layer and said resist film are laminated in this order;

(2) exposing said resist film to light through a mask to form a latent image of a resist pattern;

(3) developing the exposed resist film to form a resist pattern;

(4) etching exposed portions of said conductive inorganic powder dispersed paste layer to form a conductive inorganic powder dispersed paste layer pattern corresponding to said resist pattern and to remove said resist pattern; and (5) baking said conductive inorganic powder dispersed paste layer pattern to calcine organic substance contained therein to form electrodes.

9. The process of claim 8, wherein said conductive inorganic powder dispersed paste layer is formed by coating a resist film of a support film comprising said resist film with a paste composition comprising (a-1) conductive powder, (b) an alkali-soluble resin and (c) a solvent and drying the coated film to remove part or all of the solvent.

10. The process of claim 8, wherein said resist film in the step (1) is formed by transferring a resist film supported on a support film to the surface of another support film.

11. The process of claim 8, wherein said conductive inorganic powder dispersed paste layer of said laminate film formed on said substrate in step (1) is a laminate of a plurality of said conductive inorganic powder dispersed paste layers.

12. The process of claim 8, wherein said laminate film in step (1) is formed by transferring a single conductive inorganic powder dispersed paste layer supported on a support film 2 to 10 times to form a laminate of 2 to 10 conductive inorganic powder dispersed paste layers on said resist film of said substrate comprising said resist film.

13. The process of claim 8, wherein said laminate film in step (1) is formed by transferring a laminate of 2 to 10 conductive inorganic powder dispersed paste layers supported on a support film to a resist film on another support film comprising a resist film to form a laminate of 2 to 10 conductive inorganic powder dispersed paste layers on said resist film of said another support film.

14. A process for forming an electrode on a substrate, which comprises:

(1) transferring a laminate film, in which a resist film, a conductive powder dispersed paste layer and a reflection reducing film are laminated and supported on a support film in this order, to the surface of a substrate to form on said substrate said laminate film in which said reflection reducing film, said conductive powder dispersed paste layer and said resist film are laminated in this order, said conductive powder dispersed paste layer being formed of a paste composition which comprises (a-1) conductive powder, (b) an alkali-soluble resin and (c) a solvent;

(2) exposing said resist film to light through a mask to form a latent image of a resist pattern;

(3) developing the exposed resist film to form a resist pattern;

(4) etching exposed portions of said conductive powder dispersed paste layer to form a conductive powder dispersed paste layer pattern corresponding to said resist pattern; and (5) baking said conductive powder dispersed paste layer pattern to calcine organic substance contained therein to form an electrode.

* * * * *